Figure 1:
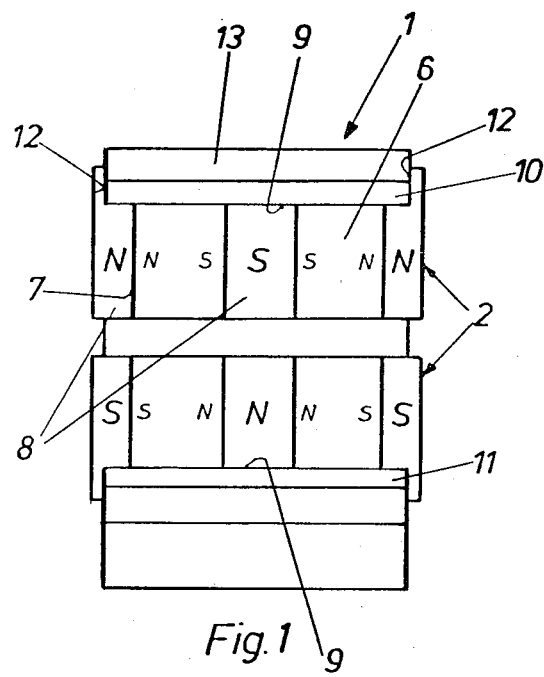

United States Patent [19]

Baermann

[11] 4,386,316

[45] May 31, 1983

[54] BRAKE MAGNET FOR WATT-HOUR METERS

[76] Inventor: Max Baermann, Postfach 26, 5060 Bergisch-Gladbach 1, Fed. Rep. of Germany

[21] Appl. No.: 195,014

[22] Filed: Oct. 8, 1980

[30] Foreign Application Priority Data

Oct. 15, 1980 [DE] Fed. Rep. of Germany ....... 2941648

[51] Int. Cl.³ .............................................. G01R 1/16
[52] U.S. Cl. ..................................... 324/152; 324/137
[58] Field of Search ............................... 324/152, 137

[56] References Cited

U.S. PATENT DOCUMENTS 2,309,414  1/1943  Nobbs ................................. 324/152
3,413,550 11/1968  Wright ................................ 324/152
3,588,768  6/1971  Baermann ........................... 324/152
4,238,729 12/1980  MacFadden et al. ............... 324/137
4,238,730 12/1980  Konashinsky et al. ............ 324/152

FOREIGN PATENT DOCUMENTS 1292257 10/1972 United Kingdom .

Primary Examiner—David C. Nelms
Attorney, Agent, or Firm—Body, Vickers & Daniels

[57] ABSTRACT

A brake magnet for watt-hour meters using permanent magnet material of low permeability of nearly one and high coercive strength in which exact temperature compensation for a required temperature range can be achieved and which is easily manufactured. The temperature compensation elements are positioned on the surfaces of the brake magnet system away from the air gap.

14 Claims, 4 Drawing Figures

U.S. Patent            May 31, 1983            4,386,316

BRAKE MAGNET FOR WATT-HOUR METERS

The invention relates to a brake magnet for watt-hour meters with brake magnet systems of anisotropical, sintered or plastic bonded permanent magnet material of low permeability of nearly one and higher coercive field strength, e.g., barium-ferrite, arranged on both sides of the meter braking disc on an essentially U-shaped carrier body of non-magnetic material, spaced by an air gap. Each brake magnet system is comprised of two right-angled permanent magnet bodies magnetized in counter direction parallel to the plane of the meter braking disc, and is provided on both pole faces with elements of good conductivity, producing alternating polarity at their poles, whereby the flux via the same elements of good conductivity closes with the opposite pole of counter polarity through the air gap and the meter braking disc therein, and the systems are provided with temperature compensation elements of a material with temperature related permeability, wherein said temperature compensation elements are arranged on the brake magnet systems on the surfaces away from the air gap.

These brake magnet systems may also include a regulating magnet for the purpose of fine adjustment of the braking torque, as described in U.S. Pat. No. 3,558,768.

BACKGROUND

The permanent magnets in brake magnet systems which have already become known are made of an Alnico alloy. This permanent magnet material has a very small error of temperature, the induction of said magnet material changing only by approximately 0.2% per 10° of temperature change. This relatively small temperature error can be compensated without difficulty by so-called temperature compensation elements. The temperature compensation elements are of a magnetizable material with a low Curie point and temperature related permeability. In most cases, iron alloys with approximately 30% nickel are used. These temperature compensation elements short-circuit a part of the available flux. With a temperature increase, the permeability of the temperature compensation elements is minimized in such a proportion that the induction of the magnet is reduced so that a constant magnetic flux is maintained in the air gap.

The constant magnetic flux in the air gap of a watt-hour meter braking magnet is important, as the braking effort on the rotor disc grows less should a reduction in the available flux occur. This causes the metal braking disc to revolve more quickly, thus showing a too high power consumption.

When using permanent magnet material based on the Alnico alloys with relatively small temperature error, the slight employment of compensating material and the consequent slight cross-leakage of magnetic lines of flux causes only minimum weakening in the effective induction of the permanent magnets. The aforementioned permanent magnet material is, however, subject to crises and is expensive.

One therefore attempted to manufacture brake magnets from permanent magnet materials available in large quantities, e.g., barium, strontium or lead ferrite, with relatively low permeability of nearly one, relatively low remanence and very high coercive field strength. This permanent magnet material produced however a large temperature error, whereby the induction changed by approximately 2% per 10° C. temperature change. As one must expect temperature changes of up to 100° C. with electricity meters, this produces an induction change of up to 20%. Such a high induction change is very hard to compensate. One must also expect a relatively extreme weakening in the available induction in the air gap due to the compensation as previously described. This is even more disadvantageous as the ferrite based permanent magnet materials produce a relatively low remanence of approximately 3,000 to 4,000 G.

A meter brake magnet for a watt-hour meter of a material of this type, with low remanence and very high coercive strength, has already become known through the German Pat. No. 947,543 and the British Pat. No. 1,292,257. In the case of said watt-hour meter brake magnets, two preferably right-angled bodies of the material mentioned are arranged on a vertical and preferably radial plane to the meter braking disc. These magnetic bodies are magnetized in counter direction to the disc of the meter rotor and are covered on both sides by elements of good conductivity, whereby the flux closes via said elements of good conductivity to the opposite elements of good conductivity of counter polarity through the air gap and the disc therein. At the same time, a small plate of a known material with temperature related permeability is positioned on the surface of the magnet arrangement facing the meter rotor, respectively the air gap, between the soft iron bodies covering both sides of the magnetic elements and flush with the pole faces of same, for the purpose of temperature compensation in the meter braking magnet.

In the case of this known embodiment in which the temperature compensation elements lie against the elements of good conductivity opposite the air gap, a change in temperature causes the magnetic density in the air gap to change. Furthermore, it is difficult to fit the temperature compensation element exactly flush, i.e. without air gap, between the elements of good conductivity. Even with the slightest fitting errors, the reproducible values of an exact temperature compensation may not be achieved.

These known brake magnets could not be put into practice as a satisfying temperature compensation in the required temperature range obviously could not be achieved and the manufacturing costs were too high.

OBJECTS

It is the object of the invention to provide a brake magnet for watt-hour meters made of an easily available, depression independent permanent magnet material of low permeability of nearly one and high coerciver strength with which the exact temperature compensation and thus constant air gap induction in the required temperature range can be achieved, despite the relatively high temperature error. Also a suitably high braking torque with a relatively small structure can be achieved.

This object is achieved in the case of the aforementioned brake magnet type in that the temperature compensation elements are positioned on the surface of the brake magnet system away from the air gap.

THE INVENTION

As can be seen in all publications of prior art, it has been the common practice to position the temperature compensation material on the surfaces of the brake magnet facing the air gap as it was believed that the effect was at its most advantageous here with regards to compensation with a good braking torque.

However, this invention leaves the path previously taken. The invention has shown in a surprising manner, that an effective temperature compensation for a constant air gap induction can be achieved within a temperature range of −10° C. to +70° C. At the same time, the brake magnet according to the invention produces the same braking torque as the known brake magnets of expensive Alnico alloy, subject to crises.

In the case of the solution according to the invention, the temperature compensation material can always be mounted in exactly the same position. This not only ensures an effective compensation of the temperature error, but manufacture is also simplified by the constant values of each system made. This is particularly important in the case of watt-hour meters so that any temperature changes occurring do not result in falsification of the measuring results.

In an advantageous embodiment, the exact position of the temperature compensation elements is reached in that the two outer elements of good conductivity on the brake magnet systems have a longitudinal recess on the end away from the air gap, in which the temperature compensation element is placed, guided and fixed, e.g. by gluing. This horizontal limb of the carrying body can also mate with this recess to ensure an exact mounting of the brake magnet systems on the carrier body. Preferably, two temperature compensation elements, varying in their Curie points, are fitted for each brake magnet, the Curie point of one element being 65° C. and the Curie point of the other being 90° C.

Due to this arrangement, an almost rectilinear path of air gap induction within a temperature range of approximately −10° C. to +70° C. can be achieved.

In a further advantageous embodiment, the bar length, i.e. the length in direction of magnetization, of the permanent magnet body of any brake magnet system should be approximately 5 to 9 millimeters, preferably 7 millimeters. In this case, the air gap width should be approximately 2 to 6 millimeters.

DRAWINGS

Figure 2:
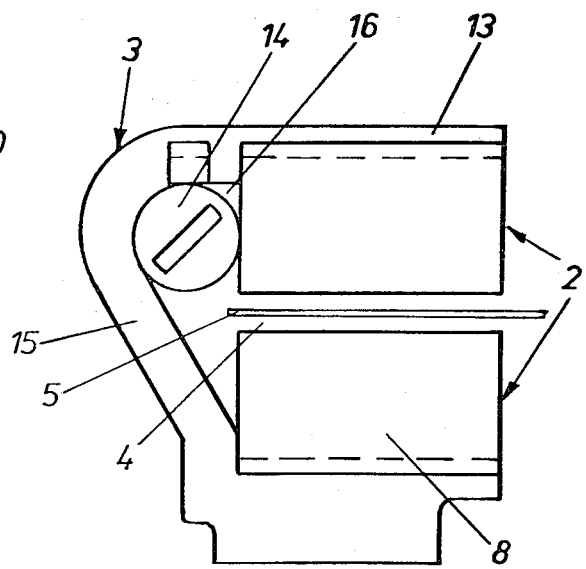
Figure 3:
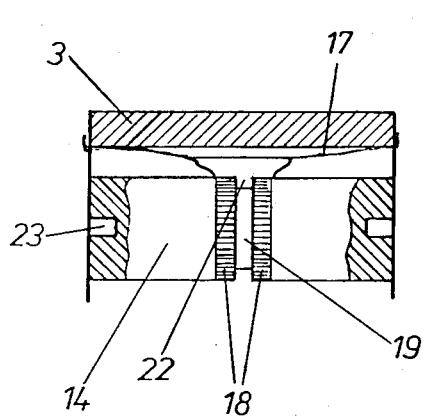
Figure 4:
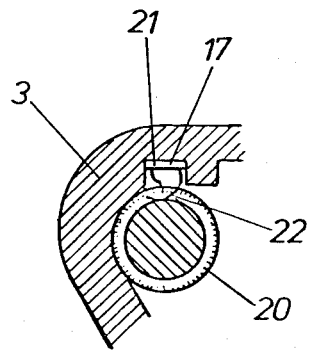

The invention may take physical form in certain parts and combinations of parts, preferred embodiments of which will be described in detail in this specification and illustrated in the accompanying drawings which are a part hereof and wherein:

FIG. 1 is a front view of the brake magnet;
FIG. 2 is a side view of the brake magnet;
FIG. 3 is a cut side view of the mounted regulating magnet; and,
FIG. 4 is a sectional side view of the mounted regulating magnet.

PREFERRED EMBODIMENTS

Referring now to the drawings wherein the showings are for illustrating preferred embodiments of the invention only and not for the purpose of limiting same, in the embodiment shown the brake magnet is fitted with a known regulating magnet for the purpose of fine adjustment of the braking torque.

In FIG. 1 the brake magnet 1 is comprised of the two brake magnet systems 2 mounted at a distance to each other on a preferably U-shaped carrier body 3 thus giving an air gap 4 in which the meter braking disc 5 rotates.

Each of the two brake magnet systems is comprised of preferably right-angled permanent magnet bodies 6 positioned on a plane perpendicular to the meter braking disc plane and magnetized in the opposite direction parallel to the meter braking disc.

The poles are marked in the drawing with the letters N and S. The bar length of the permanent magnet body 6 is marked with the letter "l" and measures 7 millimeters in the preferred embodiment. The permanent magnet bodies 6 are provided on both sides on their pole faces 7 with elements of good conductivity from which poles alternating polarity originates. Due to the opposite brake magnet system poles of differing polarity, the magnetic flux closes via the elements of good conductivity through the air gap 4 where it permeates the rotating meter brake disc therein. The polarities of the pole surfaces opposite each other are also marked with the letters N and S.

The permanent magnet body 6 is comprised of a sintered, anisotropical and ferric permanent magnet material, e.g., barium, strontium or lead ferrite.

In order to effectively compensate the temperature error of the used permanent magnet material with temperature changes in the area of approximately −10° C. to +70° C., temperature compensation elements 10, 11 are positioned on the surfaces 9 of the brake magnet systems away from the air gap. To achieve an exact and easy positioning of the temperature compensation elements, the two outer elements of good conductivity of the brake magnet system are provided with a longitudinal recess 12 into which the temperature compensation elements are placed. The horizontal limbs 13 of the carrier body 3 also mate with these recesses. This ensures exact positioning of the brake magnet systems on the carrier body. The temperature compensation elements and also the brake magnet systems can be fixed to the carrier body by gluing. The Curie point of the temperature compensation element 10 is 65° C. and the Curie point of the temperature compensation element 11 is 90° C. The temperature compensation elements with differing Curie points may be exchanged against each other in their positions.

In the side view according to FIG. 2, the brake magnet is provided with a regulating magnet 14. For this reason, the joining bridge 15 on the carrier body 3 to the horizontal limb 13 is curved to the circumference of the regulating magnet resulting in recess 16 in which the regulating magnet is freely movable and prevented from falling out by the brake magnet system 2. The regulating magnet is held into place by means of an inlaid spring 17. The regulating magnet and the spring are recognizable in FIGS. 3 and 4.

As can be seen in FIG. 3, the regulating magnet 14 is provided with two toothed rings 18 at a spacing from each other, there being between them an annular groove 19. A curved, graduated flange 21 of the spring 17 mates with the teeth 20 of the toothed rings 18. The curved stop pin 22 of the spring 17 projects into the annular groove 19. The flange 21 interlocked with the teeth 20 and the stop pin 22 projected into the annular groove 19 are recognizable in FIG. 4. The regulating magnet 14 is provided with a slit 23 for the purpose of fine adjustment of the braking torque.

The regulating magnet is magnetized in such a manner that it strengthens the braking torque when in one position and when turned by 180° weakens the braking torque. In this way, a braking torque of approximately ±2% can be achieved.

Having thus described my invention, I claim:

1. In a brake manget for watt-hour meters with brake magnet systems of anisotropical, sintered or plastic bonded permanent magnet material of low permeability of nearly one and high coercive field strength, e.g. barium-ferrite, arranged on both sides of the meter braking disc on an essentially U-shaped carrier body of non-magnetic material, spaced by an air gap, each brake magnet system being comprised of two right-angled permanent magnet bodies magnetized in counter direction, parallel to the plane of the meter braking disc, and provided on both pole faces with elements of good magnetic conductivity, producing alternating polarity at their poles, whereby the flux via the said elements of good conductivity close with the opposite pole of counter polarity through the air gap and meter braking disc therein, the improvement which comprises: the systems being provided with temperature compensation elements of a material with temperature related permeability, wherein said temperature compensation elements are arranged only on the portions of the magnet system surfaces which are substantially spaced from the air gap.

2. The improvement according to claim 1 wherein both elements of goods conductivity on the brake magnets system have a longitudinal recess on the end away from the air gap in which the temperature compensation elements are laid, guided and fixed.

3. The improvement according to claim 1 wherein both elements of goods conductivity on the brake magnet systems have a longitudinal recess on the end away from the air gap in which the temperature compensation elements are laid, guided and fixed and the horizontal limb of the carrier body mates with this recess.

4. The improvement according to claim 1 wherein two temperature compensation elements varying in their Curie point are provided, whereby the Curie point of one element is 65° C. and the Curie point of the other element is 90° C.

5. The improvement according to claim 2 or 3 wherein two temperature compensation elements varying in their Curie point are provided, whereby the Curie point of one element is 65° C. and the Curie point of the other element is 90° C.

6. The improvement according to claim 1 wherein the bar length, i.e. length in direction of magnetization, of the permanent magnet body of any brake magnet system is approximately 5 to 9 millimeters, perferably 7 millimeters.

7. The improvement according to claim 2 or 3 wherein the bar length, i.e. length in direction of magnetization, of the permanent magnet body of any brake magnet system is approximately 5 to 9 millimeters, preferably 7 millimeters.

8. The improvement according to claim 4 wherein the bar length, i.e. length in direction of magnetization, of the permanent magnet body of any brake magnet system is approximately 5 to 9 millimeters, preferably 7 millimeters.

9. The improvement according to claim 1 including a regulating magnet wherein the base of the carrier body joining the horizontal limbs is shaped in the area of the brake magnet system to correspond to the circumference of a regulating magnet thus forming a recess and a regulating magnet held in place by an inlaid spring is freely movable in this recess and is prevented from falling out by the brake magnet system.

10. The improvement according to claim 2 or 3 including a regulating magnet wherein the base of the carrier body joining the horizontal limbs is shaped in the area of the brake magnet system to correspond to the circumference of a regulating magnet thus forming a recess and a regulating magnet held in place by an inlaid spring is freely movable in this recess and is prevented from falling out by the brake magnet system.

11. The improvement according to claim 4 including a regulating magnet wherein the base of the carrier body joining the horizontal limbs is shaped in the area of the brake magnet system to correspond to the circumference of a regulating magnet thus forming a recess and a regulating magnet held in place by an inlaid spring is freely movable in this recess and is prevented from falling out by the brake magnet system.

12. The improvement according to claim 5 including a regulating magnet wherein the base of the carrier body joining the horizontal limbs is shaped in the area of the brake magnet system to correspond to the circumference of a regulating magnet thus forming a recess and a regulating magnet held in place by an inlaid spring is freely movable in this recess and is prevented from falling out by the brake magnet system.

13. The improvement according to claim 6 including a regulating magnet wherein the base of the carrier body joining the horizontal limbs is shaped in the area of the brake magnet system to correspond to the circumference of a regulating magnet thus forming a recess and a regulating magnet held in place by an inlaid spring is freely movable in this recess and is prevented from falling out by the brake magnet system.

14. The improvement according to claim 9 wherein said regulating magnet is provided with toothing comprised of two toothed rings spaced from each other forming an annular groove and a curved, graduated flange on said spring mating with said annular groove as well as with said teeth.

* * * * *